US009414447B2

(12) United States Patent
Ghasemi Afshar et al.

(10) Patent No.: US 9,414,447 B2
(45) Date of Patent: Aug. 9, 2016

(54) LED MODULE

(71) Applicant: OSRAM GmbH, Munich (DE)

(72) Inventors: Farhang Ghasemi Afshar, Wenzenbach (DE); Krister Bergenek, Regensburg (DE); Andreas Dobner, Wenzenbach (DE); Holger Huebner, Baldham (DE); Meik Weckbecker, Thalmassing (DE); Ralph Wirth, Lappersdorf (DE)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 14/133,747

(22) Filed: Dec. 19, 2013

(65) Prior Publication Data

US 2014/0191255 A1 Jul. 10, 2014

(30) Foreign Application Priority Data

Jan. 8, 2013 (DE) ........................ 10 2013 200 129

(51) Int. Cl.

| | |
|---|---|
| ***H01L 33/52*** | (2010.01) |
| ***H01L 33/44*** | (2010.01) |
| ***H01L 23/522*** | (2006.01) |
| ***F21V 33/00*** | (2006.01) |
| ***H05B 33/08*** | (2006.01) |

(52) U.S. Cl.
CPC .................................. *H05B 33/0803* (2013.01)

(58) Field of Classification Search
CPC ... F21V 5/04; F21V 23/0457; H05B 33/0827; H05B 33/0869
USPC ........................ 315/152, 294; 257/84; 349/70
See application file for complete search history.

(56) References Cited

U.S. PATENT DOCUMENTS

| | | | | |
|---|---|---|---|---|
| 7,744,242 | B2 | 6/2010 | Krämer | |
| 2002/0130326 | A1 | 9/2002 | Tamura et al. | |
| 2007/0035653 | A1 * | 2/2007 | Hong et al. | 348/340 |
| 2009/0086484 | A1 * | 4/2009 | Johnson | 362/236 |
| 2010/0219760 | A1 | 9/2010 | Tanaka et al. | |
| 2011/0205466 | A1 * | 8/2011 | Lee et al. | 349/70 |
| 2012/0125433 | A1 * | 5/2012 | Guha et al. | 136/256 |

FOREIGN PATENT DOCUMENTS

| | | | |
|---|---|---|---|
| CN | 102748681 | A | 10/2012 |
| DE | 102005022832 | A1 | 11/2006 |

OTHER PUBLICATIONS

English abstract of CN 102748681 A dated Oct. 24, 2012.
Search Report issued in the corresponding German application No. 102013200129.0, dated Aug. 21, 2013.

* cited by examiner

*Primary Examiner* — Kimberly Rizkallah
*Assistant Examiner* — Brian Turner
(74) *Attorney, Agent, or Firm* — Viering, Jentschura & Partner mbB

(57) ABSTRACT

In various embodiments, a light emitting diode module may include a carrier plate, at least one light emitting diode, and at least one sensor configured to register light emitted by the light emitting diode. The light emitting diode is attached to a light emitting diode installation side of the carrier plate. The sensor is installed countersunk through a hole of the carrier plate in relation to the light emitting diode installation side thereof.

20 Claims, 4 Drawing Sheets

LED MODULE

CROSS-REFERENCE TO RELATED APPLICATION

This application claims priority to German Patent Application Serial No. 10 2013 200 129.0, which was filed Jan. 8, 2013, and is incorporated herein by reference in its entirety.

TECHNICAL FIELD

Various embodiments relate generally to an LED module having at least one LED attached to a carrier plate.

BACKGROUND

Light-emitting diodes (LEDs) are used for greatly varying applications, e.g. for illumination. For this purpose, they are typically installed on a carrier plate, for example, a printed circuit board, in conjunction with or via which they can be encapsulated, assembled further, and also cooled. The term LED module is used here for such a carrier plate having at least one LED thereon, i.e., e.g. an LED chip.

SUMMARY

In various embodiments, a light emitting diode module may include a carrier plate, at least one light emitting diode, and at least one sensor configured to register light emitted by the light emitting diode. The light emitting diode is attached to a light emitting diode installation side of the carrier plate. The sensor is installed countersunk through a hole of the carrier plate in relation to the light emitting diode installation side thereof.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
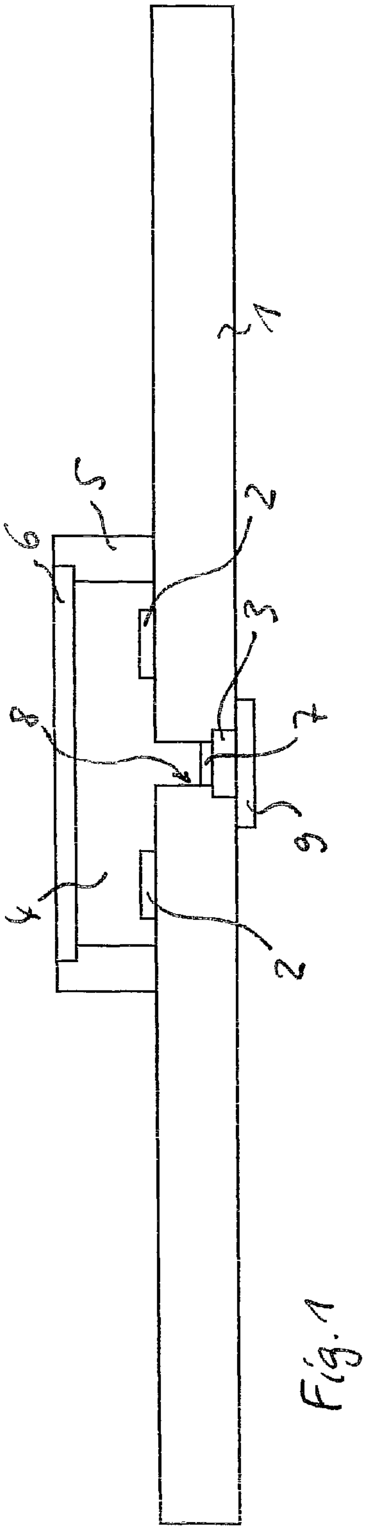
FIGS. 1 to 5 each show an embodiment in a schematic sectional view.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments may improve a light emitting diode (LED) module having an LED on a carrier plate with respect to its usage properties.

For this purpose, various embodiments are directed to an LED module and to an advantageous use thereof. Moreover, various embodiments are specified in the dependent claims and are also explained in greater detail hereafter. The individual features relate to the LED module, the uses, and fundamentally also to a method for light generation using the LED module, without an explicit differentiation being made between the various categories.

In various embodiments, the LED module has an LED on a carrier plate, wherein the LED is attached on an LED installation side of the carrier plate, i.e., for example, on the top side in the conventional mode of illustration. It can also be attached indirectly on this LED installation side, for example, via a further carrier arranged between the LED and the carrier plate, and therefore in a certain sense can also be arranged above the LED installation side of the carrier plate. In addition, according to the invention a sensor is provided for registering light which is emitted from the LED.

This sensor is to be installed countersunk in relation to the LED installation side according to various embodiments, wherein the content "downward" included in the word "countersunk" relates to the abovementioned designation of the LED installation side as the top side, which is only selected here for illustration purposes. "Countersunk" thus means in the direction toward the other side of the carrier plate. The sensor is to be installed countersunk through a hole. In other words, the sensor is to be installed countersunk because of the hole, i.e., as a consequence of the existence of this hole, e.g. in the hole and thus countersunk or on the side opposite to the LED installation side "below" the hole (i.e., in such a manner that it can register light of the LED from the opposite side through the hole). The hole is e.g. a through hole, however, it may also be a blind hole, i.e., a depression in the LED installation side of the carrier plate.

The countersunk installation of the sensor permits different advantages or advantages of different importance depending on the application:

Firstly, the sensor can be laterally shielded by the inner walls of the hole, similarly as by a screen, from interfering light or also other interfering influences. The hole is thus used as a screen or light shaft.

Secondly, the sensor can occupy a substantial installation surface and in particular can turn out to be larger than the hole if it is arranged on the opposite side under the hole. The hole must then only expose the measuring region of the sensor and the sensor itself may protrude flatly beyond the hole. Installation surface is thus saved on the LED installation side.

Thirdly, the sensor can also have a decisive installation height in specific cases. Upon installation in the hole with this installation height, it can then no longer come into consideration on the LED installation side, because it is countersunk, or is also shorter by the countersinking distance, i.e., it protrudes upward less beyond the LED installation side by this distance. If the sensor is arranged on the "bottom side", its installation height also occurs on this side. Therefore, the overall geometry on the LED installation side, which could also be impaired by a particularly tall sensor as a result of the light emission of the LEDs and the light guiding, is also unaffected by the sensor installation height.

Fourthly, for example, electromagnetic interference, which impairs the sensor, may originate from activation signals of the LEDs. In a countersunk installation position, the sensor is shielded more strongly by the carrier plate; this first really applies for an arrangement on the "bottom side" of the carrier plate opposite to the LED installation side.

In particular, shielded carrier plates exist, for example, metal core printed circuit boards, which can be very advantageous in this context. However, the enlargement of the spatial distance alone can already reduce the interference coupling.

The described advantages are illustrated here as examples and do not have to be achieved simultaneously; rather, the arrangement according to various embodiments fundamentally offers a greater design freedom and can also result in other technical functions specific to the application, which occur additionally to or instead of the mentioned advantages.

The so-called carrier plate here can be a printed circuit board bearing an LED chip, wherein LED chip means the actual individual semiconductor component, i.e., the housed piece of semiconductor. However, various embodiments also relate to cases in which the term LED from the claims does not designate the LED chip itself but rather a unit including this LED chip and an installation unit underneath it (substrate, submount, etc.), so that the concept of the carrier plate can also designate installation plates other than the actual printed circuit board. Various embodiments relate, however, to the LED chip as an LED in the meaning of the claims and the printed circuit board as a carrier plate.

The sensor is in various embodiments also installed with its top side countersunk in relation to the LED installation side, i.e., not only with its bottom side countersunk. Therefore, the sensor top side (in the direction of the emission direction of the LED) thus lies depressed in relation to the LED installation side. The above-described advantages may thus be achieved to a particular extent.

The sensor generates a signal, which can be used for controlling or regulating the LED chip, for example, characterizing the light emission of the LED in any type of way. For example, calibration measurements can also be carried out using the integrated sensor. Various applications will be discussed in greater detail.

The LED may be attached directly to the carrier plate. A planar bond is provided between the LED and the carrier plate or printed circuit board, for example, the LED can be glued or soldered onto the carrier plate, so that they are only separated by the material responsible for this planar bond. This may be a material introduced in a manner adapted to the shape and flatly between the LED and printed circuit board, preferably one which is used in free-flowing form and then solidifies.

The sensor may be integrated in the meaning that it is either in direct contact with the carrier plate or is attached within the outer edge (the planar extension in the main extension plane) of the carrier plate and can register LED light. The sensor may be integrated under the light-emitting surface of the LED module, wherein the word "under" relates to a direction from the light-emitting surface perpendicular to the carrier plate.

When reference is made to the registration of LED light by the sensor, this therefore means light emitted directly from the LED, which can be reflected, for example. However, converted light is also to be included, which was generated by a phosphor, which was excited by the LED light. The phosphor can be integrated in the LED, but this is not necessary, and the embodiments show other variants.

The term "light" describes in summary in this application visible light, infrared radiation, and ultraviolet radiation, wherein visible light is preferred.

In various embodiments, at least two LEDs are provided on the same carrier plate. They may have different colors and are to be operated jointly to generate a mixed color. Of course, this relates e.g. to the RGB applications known per se having three LED chips. According to various embodiments, all of these LED chips are to be attached to the same carrier plate, to which the sensor is also attached.

The sensor may register a mixture of the LED light of the various LEDs. For example, calibrations with respect to fabrication variations and the like can thus be carried out. In various embodiments, however, variations occurring in operation, e.g. temperature-related variations of the color values of the mixed light can also be registered. For example, the compliance with specific tolerance values can be monitored or also a control or regulation can be carried out.

The sensor can accordingly have a color filter (and can be embodied as a photodiode, for example) and of course can also consist of a plurality of individual sensors having respective color filters. Of course, a plurality of separate sensors can also be integrated according to the invention, which are each responsible here for one color, for example.

In various embodiments, the sensor can be a so-called optical color sensor, which directly outputs the finished X, Y, and Z color values and thus saves outlay for processing electronics. In various embodiments, in the case of such integrated optical color sensors, the advantages mentioned at the beginning of various embodiments with respect to the installation surface and/or the installation height come to bear.

In one variant of various embodiments, a diffuse layer, e.g. a diffusely reflecting layer, can be provided for deflecting LED light to the sensor, for example, a phosphor layer or a diffuse reflector layer. Light which is diffusely reflected on this layer or redirected in another manner is partially registered and measured by the sensor and can be light directly generated by the LED(s) or can also be converted light, for example, light which is converted by a phosphor layer directly on the LED chip and is diffusely reflected on a reflector layer or light which is redirected by conversion in the phosphor layer as a diffuse layer. The diffuse character improves the mixing, in particular in the case of the registration of LED light from a plurality of LEDs.

The integration of the sensor does not necessarily have to mean the same directness of the bonding to the carrier plate or printed circuit board as in the case of the LED chip or chips. The sensor may be attached to a separate carrier and may be attached via this carrier indirectly to the carrier plate. This can make the installation easier above all at the bottom end of a through hole through the carrier plate. Furthermore, the interference coupling can be reduced, because a part thereof is also mediated by the carrier plate itself.

In addition to the hole of the sensor, a further hole can be provided through the carrier plate, to make through contacting of the sensor easier. Therefore, a sensor line can thus be guided on the side facing away from the LED installation side outside the through hole for the sensor and through a separate hole on the LED installation side and led there, for example, to a plug contact.

Various embodiment provide a translucent, preferably transparent coupling body, which is provided on the receiving side of the sensor, i.e., "above" the sensor in the linguistic usage of this application, and supplies light thereto. It has a diffuser and/or reflector on a top side, i.e., a side opposite to the sensor, to reflect LED light to the sensor and optionally to additionally scatter the light. The coupling body can absorb the LED light on its lateral jacket surfaces. In various embodiments, it supplies the light reflected on the diffuser or reflector in an angle-selective manner to the sensor in that it totally reflects light, which is reflected similarly to an optical waveguide, within a specific angle range and absorbs or (partially) discharges outward light outside this range. An angle selection can thus be completed in the meaning of the most vertical possible incidence of the light on the sensor surface.

In this context, a screen envelope is additionally possible in a lower region of the lateral jacket surfaces, which protects against undesired light coupling. This relates e.g. to light which is directly discharged by the LED chip or chips, which has not been reflected or converted on a scattering layer or phosphor layer (outside the coupling body), like the actual light to be measured. For illustration, reference is made to the embodiments. In various embodiments, the coupling body is relatively tall in relation to the light-emitting surface of the LED module, e.g. having a total height above the emission surface between one-eighth of the mean diameter of this emission surface and the diameter itself. In various embodiments, a lower limit is at one-fourth and an upper limit is at three-fourths of this mean diameter. The emission surface is the surface emitting the effective useful light, i.e., either the mean diameter of an arrangement of LEDs or also the mean diameter of a phosphor layer above such an arrangement. Finally, this relates to the surface which generates the light relevant for the measurement by the sensor and the specified height is measured in relation to this surface. In the case of a substantially circular surface, one proceeds from the diameter, in the case of other geometries, one proceeds from a mean value.

This vertical dimensioning may have the advantage that the contributions of various parts of the emission surface and/or of various LEDs are registered with less difference and simultaneously the height of the LED module remains limited. As a result of the different distance to the center of the emission surface or to the coupling body, different weightings of relatively closer and relatively more distant LEDs or parts of the emission surface certainly occur. These differences are reduced by the height of the coupling body. In various embodiments, as will be more clear on the basis of the embodiments, above all the light beams coupled at a larger angle in relation to the LED installation side and at a relatively large height are relayed to the sensor in the coupling body, because only these light beams actually attain diffuse scattering on the top side of the coupling body and do not simply penetrate the coupling body. Vice versa, a relatively tall coupling body ensures that only the part of the light diffusely scattered on the top side of the coupling body, which is oriented substantially vertically downward, reaches the sensor. This may be advantageous because e.g. optical color sensors depend on a substantially vertical light incidence with respect to the measurement precision thereof.

Moreover, the sensor can be protected using a neutral filter from excessively strong light coupling, if a corresponding need exists. This is also illustrated in the embodiments.

The sensor signal may advantageously be used for the constant regulation of the output light current of at least one LED chip, and in the case of the use of at least two LED chips, e.g. for constant regulation of a mixed color. In addition, of course, other control or regulation applications are also conceivable, for example, to promote an adaptation of a mixed color, for example, the color temperature of a white tone, to a variable specification.

FIG. 1 shows an LED module having a carrier plate 1 and two LED chips 2 attached thereon. These chips are soldered on, i.e., are bonded in a planar manner by a solder to the upward-facing LED installation side of the carrier plate 1 using their side facing downward in FIG. 1. In the present case, two LED chips are shown, which are to represent three LED chips (RGB color mixture), however. These three LED chips 2 are arranged symmetrically around a central optical color sensor 3, i.e., at equal distance and at 120° angles to one another in relation to this center. This is not shown in FIG. 1, but a symmetrical arrangement of two LED chips at 180° is shown as representative of this.

The LED chips 2 and the color sensor 3 are embedded in a transparent material, e.g. a clear silicone material, which is designated with 4 in FIG. 1 and is held in a ring wall 5, into which it was poured. The ring wall can consist, for example, of white plastic or silicone having white scattering particles, for example, made of titanium dioxide.

A diffuse layer 6 is deposited thereon. The diffuse layer 6 can be, for example, a phosphor layer, which is excited by light of at least one LED chip 2 and converts the light. In addition, it scatters the light generated by the LED chip 2 back to a certain extent, inter alia, onto the color sensor 3. The light converted by the phosphor layer also reaches the color sensor 3 to a certain extent. The color sensor 3 can therefore deliver a signal representative of the color value of the mixed color.

Instead of a phosphor layer, the diffuse layer 6 can also be, for example, solely a scattering layer or a reflector layer consisting of fine particles. A roughened surface (without separate layer) having specific backscattering properties is also conceivable.

Furthermore, a neutral filter 7 for reduction of the incident light intensity is added to the color sensor 3, the neutral filter being applied before the embedding using the clear silicone 4 and being previously known per se. Fundamentally, such a filter 7 could also be produced by adding suitable materials to a region of the clear silicone corresponding to the filter 7.

Figure 3:
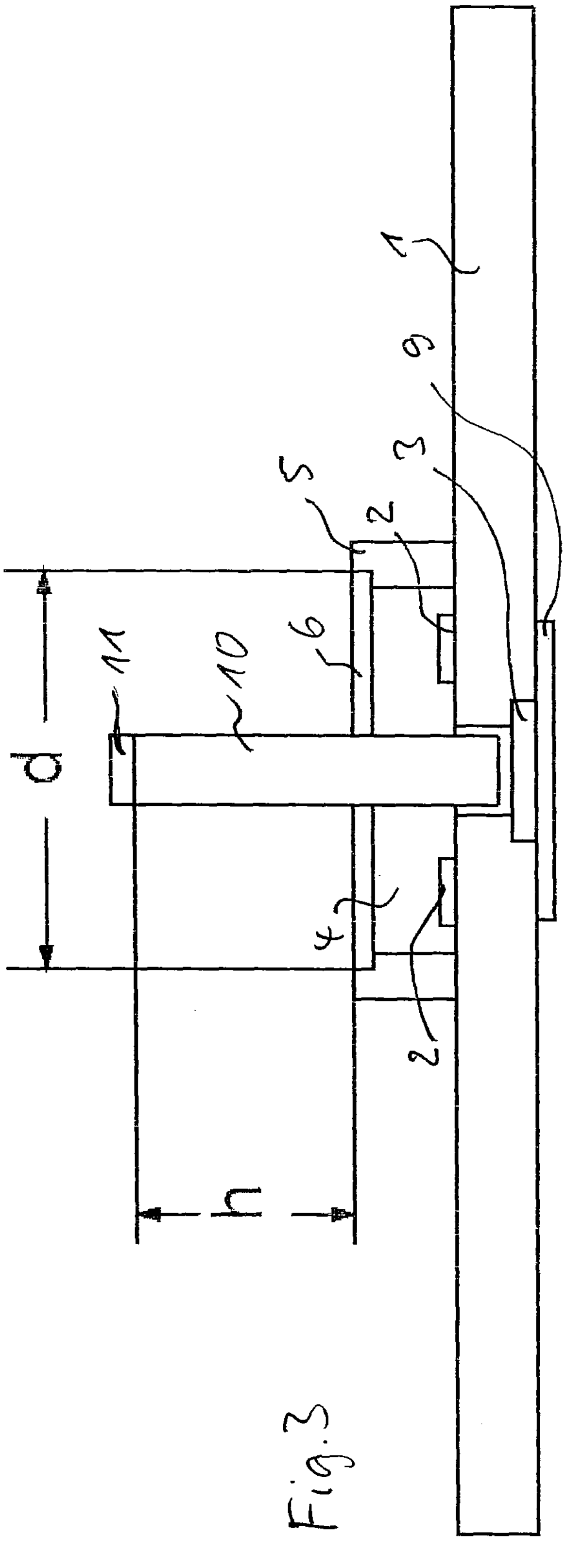

According to various embodiments, FIG. 1 shows the color sensor 3 in a countersunk position. For this purpose, the carrier plate 1 has a through hole 8 here at the corresponding position. A carrier 9, which covers this hole 8, for the color sensor 3 is attached to, for example, glued onto, the bottom side of the carrier plate 1, and holds the color sensor 3 countersunk in the hole 8. The color sensor 3 is therefore more strongly decoupled from the LED chips 2 by a greater spatial distance and by the installation (in this case by soldering) on the carrier 9 (and therefore not directly on the carrier plate 1). Moreover, the hole 8, more precisely its side walls, form a certain type of screen-like shielding in relation to the light which is reflected or converted from the diffuse layer 6. If the sensor 3 is used for the color value measurement as in these examples, the most vertical possible incidence is advantageous. Beams which deviate excessively strongly from the vertical incidence are blocked, as illustrated in FIG. 3 (although not to scale). Of course, this applies e.g. in the case of relatively tight fitting of the color sensor 3 into the hole 8 or in the case of particularly tight diameter selection of the hole 8. Moreover, the color sensor 3 could also be installed directly in the hole 8 in the event of precise fitting, i.e., attached (for example, glued on) using its lateral edges on the inner jacket surfaces of the hole 8 or attached to a narrow strip, which directly encloses the hole 8, of the back side of the carrier plate 1.

Figure 2:
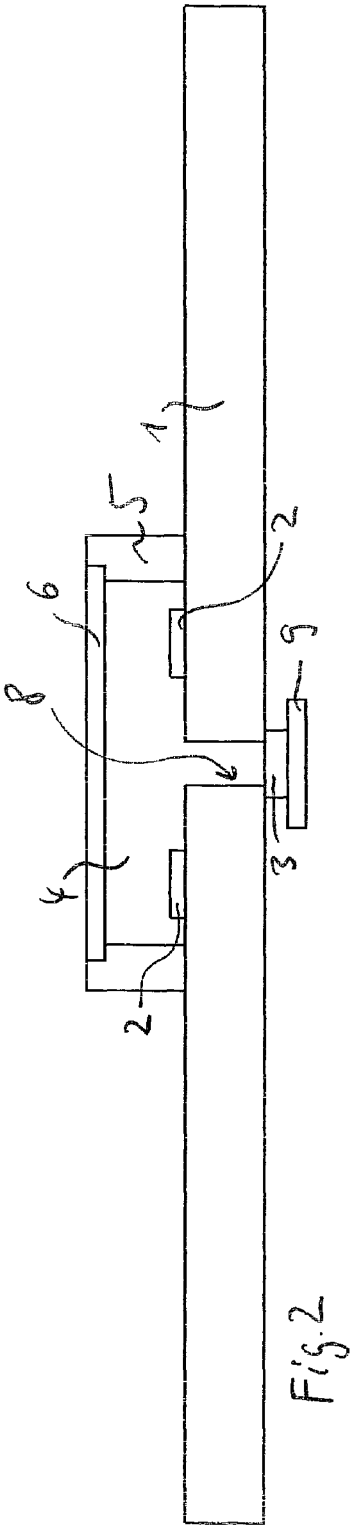

FIG. 2 shows a variant of FIG. 1, wherein the same reference signs were used for corresponding elements. In contrast to FIG. 1, the color sensor 3 is glued here using its top side onto the bottom side of the carrier plate 1. The light-sensitive region is again exposed (wherein the figures are not to scale and the color sensor can deviate significantly with respect to area and also vertical installation size). The carrier 9 is again shown here, because it can be necessary for contacting the sensor 3, for example. Of course, the variant from FIG. 2 without the carrier 9 would also be conceivable solely with respect to installation technology. Moreover the gray filter 7 is omitted here. Otherwise, the statements made on FIG. 1 apply.

FIG. 3 shows a further variant. A transparent coupling body 10, which has an upright rod shape and approximately corresponds in outline to the sensitive area of the color sensor 3, is provided above the color sensor 3. As already explained, this relates less to the registration of LED light which was reflected back by the diffuse layer 6 here, but rather to the light emitted upward from the layer 6. In this embodiment, the reflectivity of the layer 6 is not very relevant, but rather it only relates to a certain diffusivity of the emission in transmission. Therefore, a part of the emitted light is incident via the lateral jacket surfaces of the coupling body 10 on the top side thereof, which is provided with a diffusely reflecting layer 11. The reflection thereon further assists the color mixing. Of the light reflected on the layer 11, a part again leaves the coupling body 10 via the lateral jacket surfaces and the part closest to vertical exits downward through the bottom side of the coupling body 10 and is incident on the color sensor 3.

Furthermore, above all those light beams which enter the coupling body 10 at a specific height reach the diffuse layer 11, because light beams which enter lower or flatter tend more to leave the coupling body again on the opposite side. Above all, the higher proportion of the lateral jacket surface of the coupling body is thus relevant.

Moreover, the coupling body 10, as shown in FIG. 3, overall has a height h up to the bottom edge of the diffuse layer 11, which is approximately half (55% here) of the diameter d of the phosphor layer 6. This has proven to be a reasonable dimension ratio. Differences in the light emission of the phosphor layer 6 (i.e., the emission surface of the LED module) between regions located closer to the center and more distant from the center are manifested less strongly due to the height h.

In this context, it is to be noted that in practice significantly more than three LED chips 2 can also be used, for example, in the order of magnitude of 50 thereof. Since the LED chips 2 vary from one another in the properties thereof, it plays a role whether chips on the edge are considered similarly to those in the middle.

Finally, FIG. 3 illustrates that only light scattered relatively vertically downward reaches the light-sensitive surface of the color sensor 3 originating from the diffuse layer 11, because other light is coupled out or absorbed on the lateral jacket surface. It is therefore ensured that the color sensor 3 registers a substantially vertical light incidence.

Moreover, the coupling body 10 could in principle also end directly at the light-sensitive surface of the color sensor 3, which can be difficult with respect to installation and alignment technology, however. The distance shown is also only symbolic and is not meant to be to scale. Moreover, of course, the same variant is conceivable, which FIG. 2 shows with respect to FIG. 1.

The coupling body 10 thus achieves improved color mixing, uniform registration of the light actually emitted upward from the layer 6, and a certain angle selection of the measured light.

Furthermore, similarly as in the first exemplary embodiment, a neutral filter can be provided on the bottom side of the coupling body 10 and on the color sensor 3 in FIG. 3. The neutral filter is then a component of the coupling body 10 having filter attachments (but could also be embodied separately) and does not have to directly adjoin the color sensor 3.

Moreover, the intermediate space between the bottom side of the coupling body 10 (with or without neutral filter) and the color sensor 3 can be filled up using clear silicone. If attachments are added to the silicone filter, such a filling can also form the neutral filter.

Figure 4:
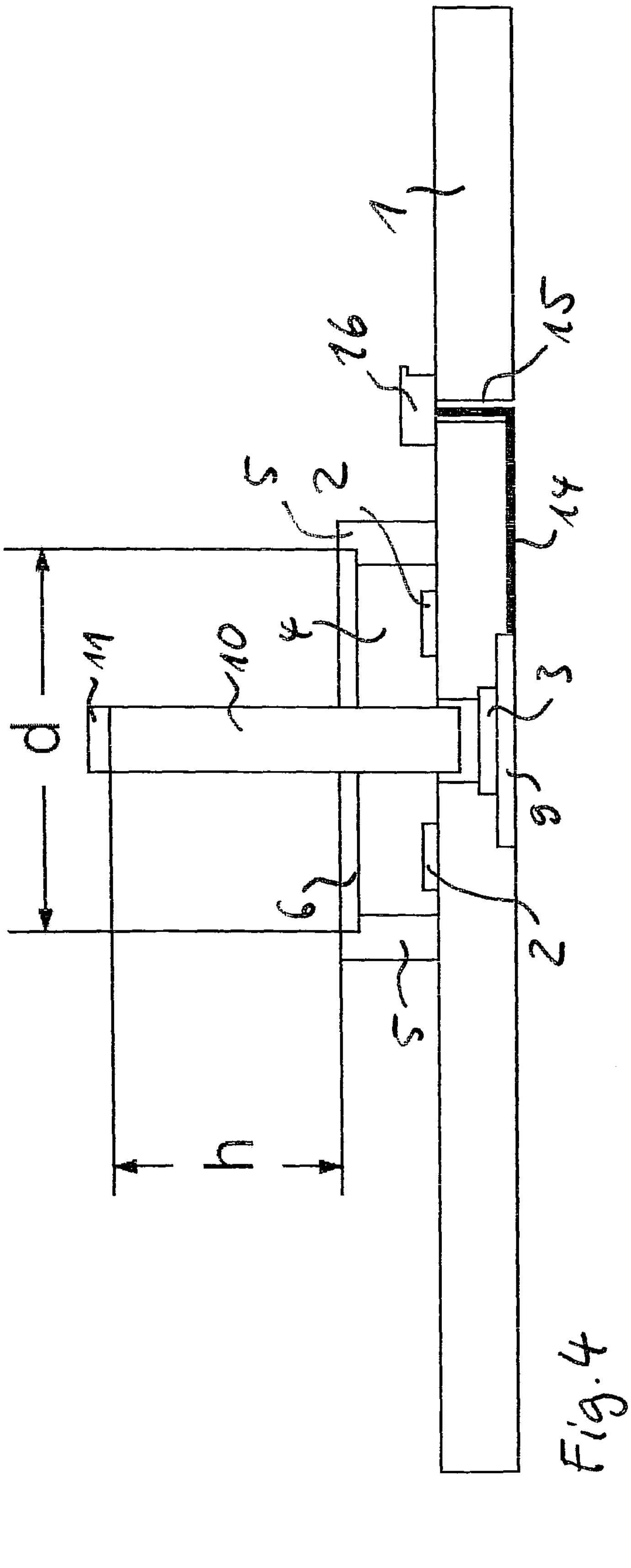

The next embodiment in FIG. 4 corresponds to that from FIG. 3, wherein in addition a line 14 (symbolically also standing for a plurality thereof) is shown here, which is led through a further through hole 15 outside the footprint of the ring wall 5 and is attached to a plug contact 16. Of course, this plug contact 16 can also be embodied in a plurality thereof or as multipolar.

Figure 5:
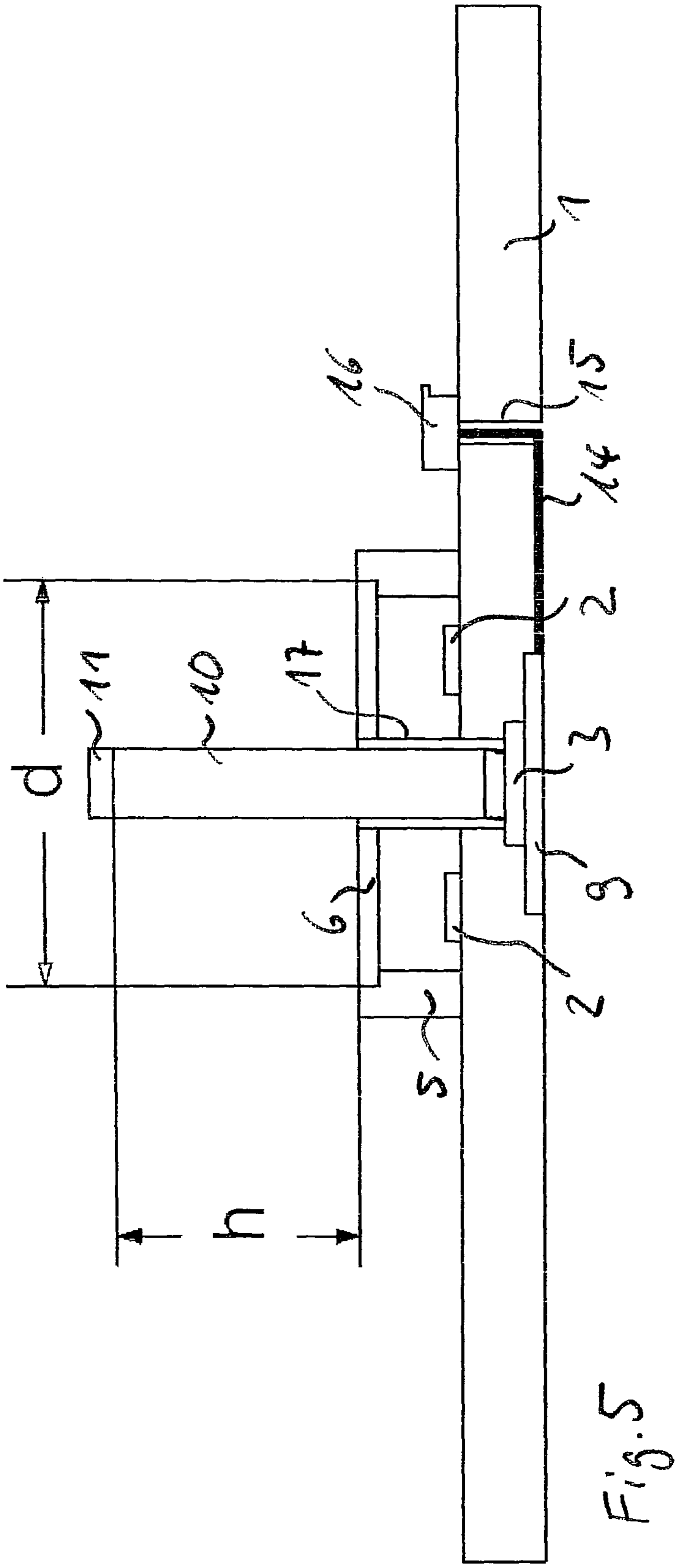

The embodiment in FIG. 5 develops the previous ones in that therein a screen envelope 17 made of opaque material, which prevents light coupling from the outside into this (vertical) region, is provided around the outer jacket surface of the coupling body 10, if it does not protrude beyond the diffuse layer 6, and around the gap underneath having the silicone filling. For example, this envelope can consist of a material having the trade name "Pocan", specifically a PBT-PET plastic, and moreover can be implemented to be as absorbent as possible on its inner side, to further increase the abovementioned angle selectivity. Specifically, only light beams are then transmitted through to the color sensor 3, which have begun at a corresponding angle above the screen envelope 17 by scattering on the top-side layer 11 or total reflection on the outer jacket surfaces of the coupling body 10 underneath. A total reflection in the region of the screen envelope 17 is then substantially precluded. Vice versa, the screen envelope 17 can also be constructed to be naturally reflective on the outside, in order to not produce excessive power losses.

Fundamentally, all embodiments show application advantages in the control and e.g. regulation of color values. It is particularly of interest here to stabilize the color values against undesired variations, thus, for example, as a consequence of a varying LED temperature. Aging phenomena can also play a role. The details of such controls and regulations, e.g. constant regulations, are as such conventional. Various embodiments are well suited for this application context.

In various embodiments, the most vertical possible measuring light incidence and the best possible mixing of the measured light are advantageous. For this purpose, e.g. the described coupling body 10 is used, which can also have a shape other than that shown, of course.

Above all in the case of RGB applications having a plurality of LED chips, the temperature influence on the color values is an entirely relevant problem, for example, because red LED chips display a more pronounced temperature-dependent degradation than, for example, blue LED chips and therefore color values can shift. Regulation with the aid of the color sensor 3 can therefore increase the power of a red LED chip with increasing temperature, for example.

This temperature stabilization or fundamentally a stabilizing regulation (also with respect to fabrication variations) relates both to a constant regulation of predefined stationery values and also desired readjustments of color values or time-dependent color changes.

Fundamentally, however, the invention also relates to the integration of a sensor for other purposes, for example, for power regulation in the case of only one single LED chip or a plurality of LED chips of the same color.

In various embodiments, the LED module may be used for regulating the discharged light current of the LED(s), e.g. for regulating the mixed color of a plurality of LED(s).

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A light emitting diode module, comprising:

a carrier plate;

at least one light emitting diode; and at least one sensor configured to register light emitted by the light emitting diode, wherein the light emitting diode is attached to a light emitting diode installation side of the carrier plate, wherein the carrier plate includes a through hole, the through hole comprising a bore having a first diameter in a first portion thereof, and a second diameter larger than said first diameter in a second portion thereof, the second portion defining a recess in said carrier plate co-axial with said first portion, wherein the sensor is installed countersunk within the recess.

2. The light emitting diode module of claim 1, further comprising:

at least one second light emitting diode, which are attached jointly to the carrier plate.

3. The light emitting diode module of claim 2, wherein the at least one light emitting diode and at least one second light emitting diode are of different colors, wherein the sensor is designed for registering light emitted from the light emitting diodes in mixed form.

4. The light emitting diode module of claim 3, further comprising: an at least translucent coupling body, which is arranged above the sensor in relation to an emission direction of the light emitting diodes, and has at least one of a diffuser or reflector on a top side in relation to the emission direction and is designed for the purpose of absorbing light generated by the light emitting diodes on a lateral jacket surface and supplying it, in at least one of mixed form or vertically selected with respect to the sensor surface, to the sensor.

5. The light emitting diode module of claim 4, wherein a height of the coupling body above an emission surface of the light emitting diode module is between one-eighth of the mean diameter of this emission surface and this diameter.

6. The light emitting diode module of claim 4, wherein the sensor is protected by a screen envelope in a lower region of the lateral jacket surface against undesired light coupling.

7. The light emitting diode module of claim 2 wherein the sensitive surface of the sensor has an area larger than a cross-sectional area of said first portion.

8. The light emitting diode module of claim 1, wherein the sensor is installed with its light emitting diode installation side countersunk in an emission direction of the light emitting diodes in relation to the light emitting diode installation side of the carrier plate.

9. The light emitting diode module of claim 1, wherein the sensor is connected through a connection hole through the carrier plate to a connection element.

10. The light emitting diode module of claim 9, wherein the sensor is connected through the connection hole through the carrier plate to a plug contact on the light emitting diode installation side of the carrier plate.

11. The light emitting diode module of claim 1, wherein the sensor is arranged under a diffuse layer with respect to an emission direction of the light emitting diodes, and is designed for the purpose of registering light, which is generated by the light emitting diodes and is diffusely reflected by the diffuse layer.

12. The light emitting diode module of claim 11, wherein the diffuse layer comprises a phosphor layer.

13. The light emitting diode module of claim 1, wherein the sensor is attached to a separate carrier and via this carrier to the carrier plate.

14. The light emitting diode module of claim 1, wherein the sensor is an optical color sensor, which can output X, Y, and Z color values.

15. The light emitting diode module of claim 1, further comprising: a neutral filter on the sensor for light current reduction.

16. The light emitting diode module of claim 1, further comprising: a second carrier plate arranged between the light emitting diode and the carrier plate.

17. The light emitting diode module of claim 1, wherein the hole is configured to maintain the sensor at a predetermined installation height from the installation side of the carrier plate.

18. The light emitting diode module of claim 1, wherein said first portion exposes only a part of a sensitive surface of the sensor toward the emission side of the light emitting diodes.

19. A light emitting diode module, comprising:

a carrier plate;

at least one light emitting diode; and at least one sensor configured to register light emitted by the light emitting diode, wherein the light emitting diode is attached to a light emitting diode installation side of the carrier plate, wherein the carrier plate includes a through hole, the through hole comprising a bore having a first diameter in a first portion thereof, and a second diameter larger than said first diameter in a second portion thereof, the second portion defining a recess in said carrier plate co-axial with said first portion, wherein the sensor is installed countersunk within the recess wherein the carrier plate is configured to shield the sensor from electromagnetic interference.

20. A light emitting diode module, comprising:

a carrier plate;

at least one light emitting diode; and at least one sensor configured to register light emitted by the light emitting diode, wherein the light emitting diode is attached to a light emitting diode installation side of the carrier plate;

wherein the carrier plate includes a through hole, the through hole comprising a bore having a first diameter in a first portion thereof, and a second diameter larger than said first diameter in a second portion thereof, the second portion defining a recess in said carrier plate co-axial with said first portion, wherein the sensor is installed countersunk within the recess, wherein the sensor is:

arranged under a diffuse layer with respect to an emission direction of the light emitting diodes, the diffuse layer configured to receive light directly from the light emitting diodes;

designed for the purpose of registering light, which is generated by the light emitting diodes and is diffusely reflected by the diffuse layer, wherein the side walls of the hole are configured to form a screen shielding of light emitted by the light emitting diode which is reflected or converted from the diffuse layer, wherein a sensitive surface of the sensor is larger than the hole.

* * * * *